United States Patent [19]
Jin et al.

[11] Patent Number: 5,538,800
[45] Date of Patent: Jul. 23, 1996

[54] MAGNETORESISTIVE OXIDE MATERIAL AND ARTICLES COMPRISING THE MATERIAL

[75] Inventors: Sungho Jin, Millington; Mark T. McCormack, Summit; Henry M. O'Bryan, Jr., Plainfield; Warren W. Rhodes, Raritan; Thomas H. Tiefel, North Plainfield, all of N.J.

[73] Assignee: AT&T Corp., Murray Hill, N.J.

[21] Appl. No.: 315,160

[22] Filed: Sep. 29, 1994

[51] Int. Cl.$^6$ ................................................. B32B 9/00
[52] U.S. Cl. .................. 428/692; 428/694 R; 428/702; 428/900; 324/252; 338/32 R
[58] Field of Search ................. 428/692, 694 R, 428/702, 900; 324/252; 338/32 R; 252/62.51

[56] References Cited

U.S. PATENT DOCUMENTS

| | | | |
|---|---|---|---|
| 5,068,050 | 11/1991 | Inomata | 252/62.51 |
| 5,342,704 | 8/1994 | Vasilow | 429/31 |
| 5,411,814 | 5/1995 | Jin | 428/692 |

OTHER PUBLICATIONS

"Thousandfold Change . . . La–Ca–Mn–O Films", Jin, *Science*, vol. 264, 15 Apr. 1994, 413–415.

F. S. Gallaso, "Structure and Properties of Inorganic Solids", Pergamon Press, New York, 1970, pp. 8–11.

"Solid State Magnetic Field Sensors and Applications", by J. Heremans, *J. Physics, D: Applied Physics*, vol. 26, pp. 1149–1168, 1993.

"The Magnetoresistive Sensor–A Sensitive Device For Detecting Magnetic Field Variations", by U. Dibbern, et al., *Electronic Components and Applications*, vol. 5, No. 3, Jun. 1983, pp. 148–153.

*Primary Examiner*—Ellis P. Robinson
*Assistant Examiner*—Timothy M. Speer
*Attorney, Agent, or Firm*—Eugen E. Pacher

[57] ABSTRACT

Materials of composition $La_vX_wM_yMn_zO_x$, with x selected from Mg, Sc, Al, Zn, Cd, In and the rare earths that have an ionic radius smaller than that of La, with M selected from Ca, Sr, Ba and Pb, and with v, w, y, z and x in the ranges 0.45–0.85, 0.01–0.20, 0.20–0.45, 0.7–1.3 and 2.5–3.5, respectively, can have substantially improved magnetoresistance (MR) ratios, as compared to the corresponding X-free comparison material. In particular, the novel materials in polycrystalline (or non-epitaxial thin film) form can have relatively large MR ratios. For instance, polycrystalline $La_{0.60}Y_{0.07}Ca_{0.33}MnO_x$ had a peak MR ratio in excess of 10,000% (in absolute value) in a field of 6 T.

8 Claims, 2 Drawing Sheets

MAGNETORESISTIVE OXIDE MATERIAL AND ARTICLES COMPRISING THE MATERIAL

FIELD OF THE INVENTION

This invention pertains to magnetoresistive materials, specifically manganese-oxide based materials, and to articles (e.g., a magnetic field probe or a recording head) that comprise the material.

BACKGROUND OF THE INVENTION

The "magnetoresistance" (MR) of a material is the resistivity $\rho(H)$ of the material in an applied magnetic field (H) minus the resistivity $\rho_0$ of the material in the absence of the applied field. This difference $\Delta\rho$ is typically normalized (e.g., by dividing by $\rho(H)$) and expressed as a magnetoresistance ratio in percent.

Recently, giant MR ratios were observed in mixed metal oxides, exemplarily in La—Ca—Mn—oxide and in thin films of La—Ba—Mn—oxide.

Co-assigned U.S. patent application Ser. No. 08/228,168, filed Apr. 15, 1994 by S. Jin et al., (which is a continuation-in-part of Serial No. 08/154,766, now abandoned) which is incorporated herein by reference, discloses mixed metal oxides that can exhibit a negative MR ratio of 200% or more (in absolute value) at room temperature, typically attained at relatively high fields, e.g., at 6 Tesla. The '766 application also disclosed a method of making such material. Co-assigned U.S. patent application Ser. No. 08/187,668, filed Jan. 26, 1994 by S. Jin et al. and also incorporated herein by reference, discloses improved MR materials based on La—Ca—Sr—Mn—oxide or La—Ca—Ba—Mn—oxide, which can exhibit more sensitive MR behavior in low magnetic fields. See also S. Jin et al., *Science*, Vol. 264, p. 413 (1994), which shows very high MR ratios in excess of $-100,000\%$ at $\sim 77K$. The paper inter alia also discloses that very high MR values of La—Ca—Mn—oxide typically are observed only in. epitaxial films on single crystal substrates.

For many technological applications of the mixed oxide materials it would be advantageous if high MR could be obtained from polycrystalline or near-polycrystalline samples of the materials. This could result in reduced cost. Furthermore, it could simplify design, since many otherwise desirable single crystal substrates do not have a lattice parameter that can support epitaxial growth of the relevant mixed oxides. This application discloses such mixed oxide material.

SUMMARY OF THE INVENTION

The invention is embodied in an article that comprises a quantity of magnetoresistive material that comprises La, Mn and oxygen, and further comprises one or more elements X selected from Mg, Sc, Al, Zn, Cd, In and the rare earths that have an ionic radius smaller than that of La, and one or more elements M selected from Ca, Sr, Ba and Pb. The material has nominal composition $La_vX_wM_yMn_zO_x$, where v, w, y, z and x are in the ranges 0.45–0.85, 0.01–0.20, 0.2–0.45, 0.7–1.3 and 2.5–3.5, respectively. The "rare earths" herein are Y and the elements of atomic number 57–71. Currently preferred are the so-called "perovskite-forming" rare earths (Y, Pr, Nd, Sm and Gd). Ionic radii of the rare earths are known. See, for instance, F. S. Gallaso, "Structure and Properties of Inorganic Solids", Pergamon Press, New York 1970, pp. 8–11.

The invention is also embodied in an article that comprises a quantity of magnetoresistive oxide that exhibits a magnetoresistance ratio greater (in absolute value) than 2000% in a magnetic field of 6 T, wherein the oxide is polycrystalline material (bulk or thick film ) or is a thin film on a substrate that is not epitaxial with the substrate.

It is also embodied in an article that comprises a quantity of magnetoresistive oxide that contains La, Mn, M and X (with M and X as defined above) and a MR ratio that is at least twice (preferably at least 5 times) as large (in absolute value) as the MR ratio of a X-free comparison material. By way of example, the "X-free comparison material" of a material of nominal composition $La_vX_wM_yMn_zO_x$ has nominal composition $La_{v+w}M_yMn_zO_x$. By "nominal composition" we mean herein that composition that corresponds to the starting material composition. The nominal composition may differ slightly from the actual composition due to, for instance, loss of a minor amount of one of the elements during processing.

DETAILED DESCRIPTION

Figure 1:
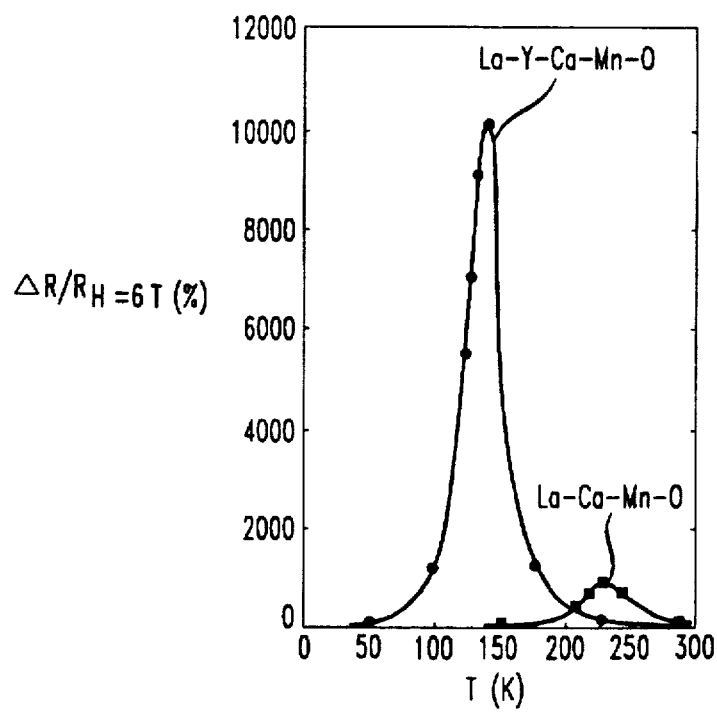
FIG. 1 shows MR as a function of temperature of sintered prior art material and of material according to the invention.

We have discovered that addition of a relatively small amount of X (e.g., Y) to some prior art compositions (e.g., to the La—Ca—Mn—O perovskite), or substitution of a relatively small amount of X for La, can result in polycrystalline (or non-epitaxial) material having a substantially larger (typically at least twice as large in absolute value) MR ratio than the prior art X-free comparison material. The drastic improvement in MR ratio by appropriate doping may be associated with a reduction in lattice parameter. We have observed that the lattice parameter of exemplary material according to the invention decreases progressively with the amount of X. For instance, the lattice parameter of an exemplary sintered material according to the invention, ($La_{0.60}Y_{0.07}Ca_{0.33}MnO_x$), is 0.3859 nm, when indexed as a pseudo-cubic crystal, and the lattice parameter of $La_{0.54}Y_{0.13}Ca_{0.33}MnO_x$ is 0.3854 nm, both noticeably smaller than the lattice parameter (0.3867 nm) of the prior art X-free comparison material ($La_{0.66}Ca_{0.33}MnO_x$). Based on our results to date we believe that the appropriate dopant elements have ionic radius smaller than that of La (0.122 nm), in order to bring about a reduction in lattice parameter. However, other mechanisms may be operative and thus can presently not be excluded.

The choice of the dopant X should be such that the resultant mixed oxide material has a lattice parameter at least 0.05% smaller, preferably at least 0.1% smaller than that of the corresponding X-free comparison material. Preferred materials according to the invention are perovskites, or have perovskite-like structure. If the dopant ions are too small, the formation of the perovskite structure may become difficult. The lattice parameter of material according to the invention typically is at most 3%, preferably at most 1%, smaller than that of the X-free comparison material. Preferred choice of dopant element X includes Y, Sc, Al, Mg, Zn, Cd and Zn. Among these, Y is currently most preferred.

At least one of the four M elements (Ca, Sr, Ba, Pb) is used to partially substitute for La, and thus impart the valence fluctuation in Mn (e.g., $Mn^{3+}$ and $Mn^{4+}$) believed to be needed for electrical conductivity and ferromagnetism. Ca is the currently preferred substituent.

Preferred composition ranges for the inventive materials are: $v=0.45{\sim}0.85$, $w=0.01{\sim}0.20$, $y=0.2{\sim}0.45$, $z=0.7{\sim}1.3$, and $x=2.5{\sim}3.5$. Even more preferred ranges are: $v=0.55{\sim}0.75$, $w=0.02{\sim}0.15$, $y=0.25{\sim}0.40$, $z=0.7{\sim}1.3$, and $x=2.5{\sim}3.5$.

The inventive magnetoresistive material can be synthesized and formed into a bulk material body, a thick film, thin film or single crystal form by any appropriate technique.

Exemplarily, bulk material according to the invention can be prepared as follows. Powder of the desired composition is formed by a process that comprises mixing of stoichiometric mounts of, e.g., oxides, carbonates, or hydroxides of La, X, M and Mn, maintaining the mixture for an extended period (e.g., 1–20 hours) at an elevated temperature (e.g., 800°–1300° C.) in an oxygen-containing atmosphere, cooling the resulting calcined material to room temperature and comminuting the calcined material. Optionally the calcining and comminuting steps are repeated one or more times. The thus produced powder can then be pressed into a desired form and sintered, typically in the range 800°–1500° C. for 0.5–1000 hours, preferably 1100°–1400° C. for 1–100 hours.

The powder can also be mixed with a known carrier (e.g., polyvinyl alcohol and optional organic binder) to form a paste or slurry, and the mixture applied to a substrate by, e.g., a doctor blade, by screen printing or spray coating to produce a thick film material. After conventional pyrolysis of the carrier, the remaining solid material is heat treated, substantially as described above for bulk material.

Thin films of material according to the invention can be formed by any suitable physical or chemical deposition technique, e.g., sputtering, laser ablation, evaporation, molecular beam epitaxy, chemical vapor deposition, electroplating, electroless plating and plasma spray deposition, typically followed by an oxidation step. Laser ablation and off-axis sputtering are the currently preferred thin film deposition techniques. As those skilled in the art know, these processes can readily yield a deposit that has substantially the same composition as the target. The target exemplarily is formed as described above.

Deposited films are optionally heat treated, typically in the range 700°–1100° C. for 0.1–100 hours, preferably in the range 800°–1000° C. for 0.5–20 hours.

Heat treatment of material according to the invention generally involves heating in an oxygen-containing atmosphere, typically in an atmosphere of more than 0.2 atmospheres $O_2$ partial pressure. The values of materials parameters such as MR ratio and zero field resistivity $\rho_0$ will typically depend, at least to some degree, on the details of the heat treatment. The conditions that will result in a desired value of a given parameter or parameters typically cannot be specified in advance, but can generally readily be determined by routine procedures.

An important and surprising feature of material according to the invention is attainment of very large MR ratios in polycrystalline bulk material, thick films, and thin films that do not have to be epitaxially grown or even be single crystalline. However, use of material according to the invention in the form of a single crystal thin film or an epitaxial thin film is at least in principle not excluded.

Growth of thin films according to the invention on non-crystalline (amorphous) substrates is currently preferred. Examples of such substrates are glass or glass-coated substrates, or a Si substrate coated with an amorphous $SiO_2$ layer. A single crystal substrate with a lattice parameter substantially different from that of the inventive material (e.g., $Al_2O_3$, quartz, $ZrO_2$) can also be used.

The maximum magnetoresistance ratio (in absolute value) of the inventive material, e.g., in terms of the percent change in resistance $\Delta R/R_H$ at $H=6$ T, is desirably at least 200%, preferably at least 1000% and more preferably at least 2000%. High MR ratios in the inventive materials are typically observed at temperatures of 77K–250K, but it is expected that an appropriate choice of composition and processing will result in high MR values near room temperature or above. The MR ratios of the inventive materials are at least twice, and preferably five times, larger than those of the corresponding X-free comparison material.

EXAMPLE

A prior art ceramic material with a nominal composition of $La_{0.67}Ca_{0.33}MnO_x$ was prepared as follows: stoichiometric amounts of $La_2(CO_3)_3$, $CaCO_3$, and $MnCO_3$ were mixed. The mixture was ball milled, calcined at 900° C. for 12 h in 1 atmosphere oxygen, and ground after cooling. The resulting powder was pressed into a disk of about 0.375 inch (0.95 cm) dia. and 0.140 inch (0.35 cm) thickness, followed by sintering of the disk at 1400° C. for 4 h in the oxygen atmosphere, followed by furnace cooling. A thin slice of the resulting ceramic sample (0.160×0.140×0.010 inches, corresponding to 0.41×0.35×0.025 cm) was cut and the magnetoresistance ratio of the sample was measured at various temperatures between room temperature and about 50K by means of a conventional 4-point probe technique. Currents in the range of 0.1–40 mA were used, and the MR ratio was found to be essentially independent of the current used. The maximum applied field was $H=6$ T. The highest MR ratio occurred at 230K, and the value was about 1030%, as shown in FIG. 1. The zero field resistance at this temperature was about $3.16\Omega(\rho{\sim}70$ m$\Omega$.cm). The lattice parameter of this material was 0.3867 nm.

A ceramic material according to the invention, with nominal composition $La_{0.60}Y_{0.07}Ca_{0.33}MnO_x$, was prepared substantially as described above. $Y_2O_3$ powder was used as a source for yttrium. A thin slice of the resulting sintered, polycrystalline La—Y—Ca—Mn—O sample with an average grain size of about 20 μm was cut and the MR ratio was measured at various temperatures. As shown in FIG. 1, the Y-addition resulted in a significant increase in the MR ratio. The peak absolute value was in excess of 10,000%, which is about 10 times higher than that for the Y-free comparison material. The MR peak occurs at ~140K, which is also near the temperature of peak zero field resistance ($R_o{\approx}540$ Ω). The lattice parameter for the La—Y—Ca—Mn—O material was 0.3859 nm, significantly smaller than that for the Y-free comparison material.

Figure 2:
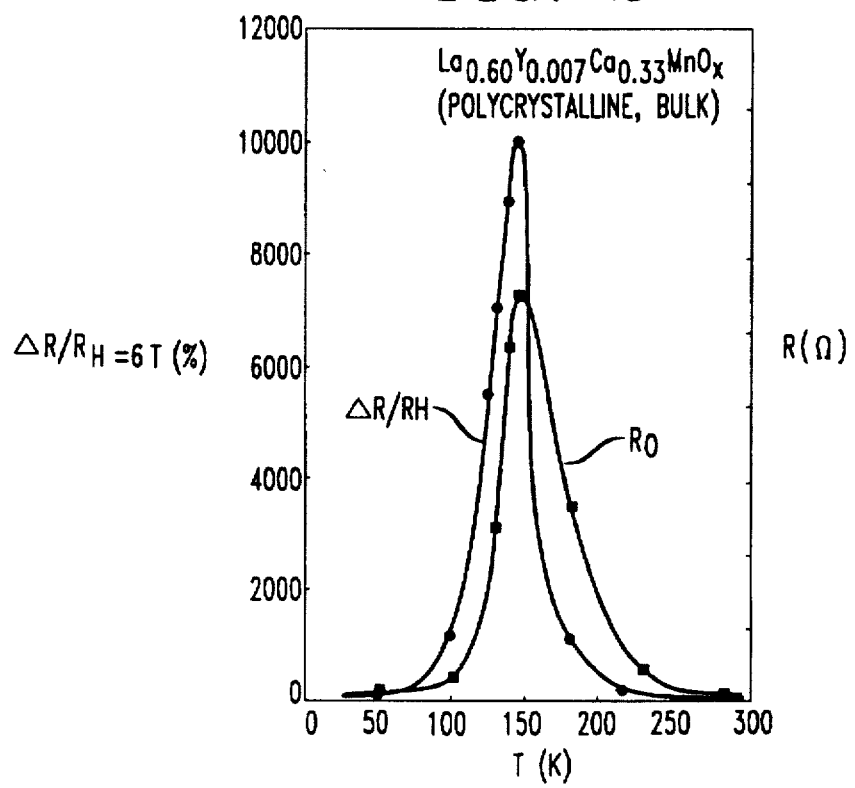
FIG. 2 is a plot of electrical resistance and MR ratio of polycrystalline $La_{0.60}Y_{0.07}Ca_{0.33}MnO_x$ as a function of measurement temperature.
Figure 3:
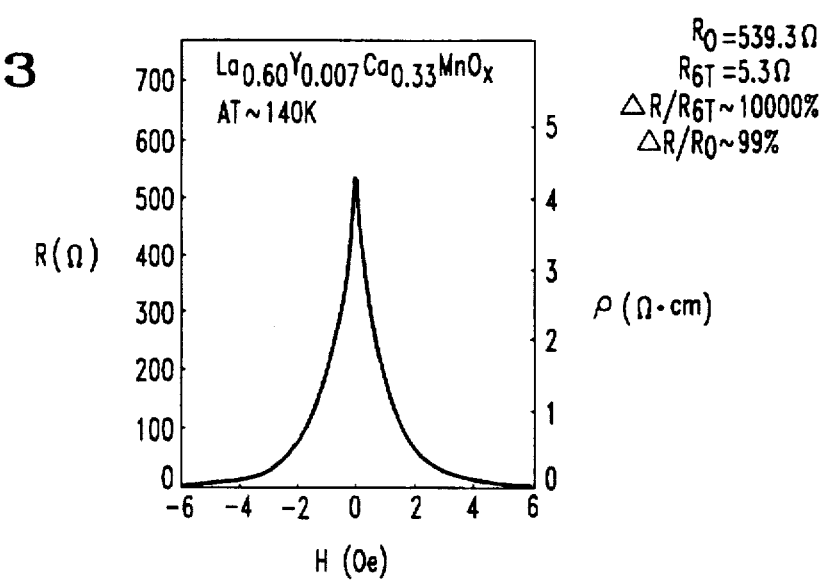
FIG. 3 shows resistance R and resistivity of a material of nominal composition $La_{0.60}Y_{0.07}Ca_{0.33}MnO_x$ at about 140K shown as a function of applied field.
Figure 4:
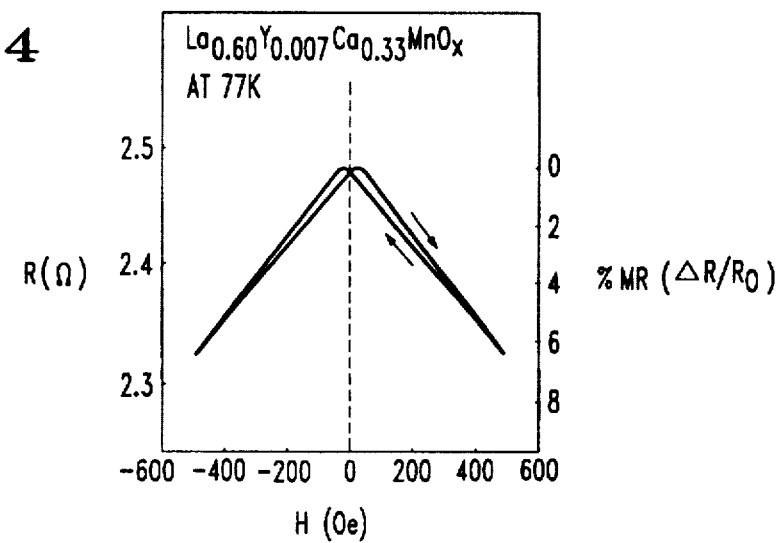
FIG. 4 shows R vs. applied magnetic field for the sample of FIG. 3 at 77K in low magnetic fields.

FIG. 2 shows the MR ratio (at $H=6$ T) and zero field resistance of the polycrystalline bulk sample according to the invention. Shown in FIG. 3 is the resistance vs field curve at ~140 K for the La—Y—Ca—Mn—O sample. The resistance decreases with increasing field, with the steepest decrease occurring in relatively low fields. This is advantageous, since in at least some applications of magnetoresistive materials large changes in the MR at low field values are of interest. Shown in FIG. 4 is the MR and R vs H curve of the Y-doped sample at 77K. The MR ratio at H=500 Oe is about 6.5%. The MR ratio at 140K at the same field is about 4.2%. The arrows indicate the direction of change in the applied magnetic field.

Figure 5:
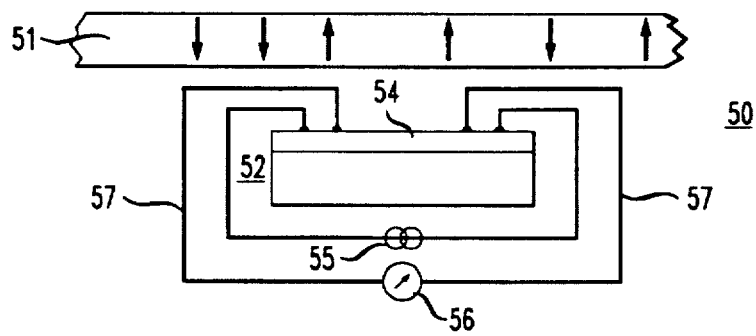
FIG. 5 schematically depicts an exemplary embodiment of an article that utilizes material according to the invention.

The oxide material according to the invention can be used for a variety of applications, including sensor devices such as a magnetic read head, and voltage or current sensors in electric devices. FIG. 5 schematically shows exemplary apparatus 50 according to the invention, namely, an apparatus that senses variations of magnetization in a magnetic tape 51, and provides a responsive voltage signal. The magnetic tape moves past sensing head 52, the latter comprising a substrate body 53 and a film 54 of inventive material thereon. Arrows indicate magnetization direction in the magnetic tape. Means 55 provide a DC current to film 54. The film is contacted by conductors 57, and voltage-responsive means 56 respond to the voltage across the magnetoresistive layer 54. J. Heremans, *J. Physics D: Applied Physics*, Vol. 26, p. 1149 (1993), and U. Dibbern et al., *Electronic Components and Applications*, Vol. 5(3), p. 148 (June 1983) provide background on magnetoresistive sensors and are incorporated herein by reference.

We claim:

1. An article comprising a quantity of magnetoresistive material that comprises La, Mn and oxygen, CHARACTERIZED IN THAT the material has nominal composition $La_vX_wM_yMn_zO_x$, where X is selected from the group consisting of Mg, Sc, Al, Zn, Cd, In and the rare earths that have an ionic radius smaller than that of La, M is selected from the group consisting of Ca, Sr, Ba and Pb, v is in the range 0.45–0.85, w is in the range 0.01–0.20, y is in the range 0.2–0.45, z is in the range 0.7–1.3, and x is in the range 2.5–3.5.

2. An article according to claim 1, wherein X is selected from the group consisting of Mg, Sc, Al, Zn, Cd, Y, Pr, Nd, Sm and Gd.

3. An article according to claim 2, wherein X is Y.

4. An article according to claim 1, wherein v, w, y, z and x are in the ranges 0.55–0.75, 0.02–0.15, 0.25–0.40, 0.7–1.3 and 2.5–3.5, respectively.

5. An article according to claim 1, wherein said quantity of magnetoresistive material comprises polycrystalline material, or said quantity comprises a thin film of the material that is not epitaxial with a substrate.

6. An article comprising a quantity of magnetoresistive material that comprises La, Mn, M and O, where M is selected from the group consisting of Ca, Sr, Ba and Pb; CHARACTERIZED IN THAT i) the quantity of material comprises polycrystalline material or a thin film that is not epitaxial with a substrate; and ii) the quantity of material has a peak magnetoresistance ratio at 6 Tesla of more than 2000% in absolute value, wherein the material also comprises X, where X is selected from the group consisting of Mg, Sc, Al, Zn, Cd and the rare earths that have an ionic radius smaller than that of La.

7. An article comprising a quantity of magnetoresistive material that comprises La, Mn, M and O, where M is selected from the group consisting of Ca, Sr, Mn and Pb; CHARACTERIZED IN THAT the quantity of material comprises one or more further elements X selected to provide the quantity of material with a peak magnetoresistance ratio in a field of 6 T that is at least twice as large in absolute value as the peak magnetoresistance ratio of an X-free comparison material in a field of 6 T, where X is selected from the group consisting of Mg, Sc, Al, Zn, Cd and the rare earths that have ionic radius smaller than that of La.

8. An article comprising a quantity of magnetoresistive material that comprises La, Mn, M and O, where M is selected from the group consisting of Ca, Sr, Ba and Pb; CHARACTERIZED IN THAT the quantity of material comprises one or more further elements X selected to provide the quantity of material with a lattice constant that is at least 0.05% smaller than the lattice constant of an X-free comparison material, whereby the quantity of material has an improved magnetoresistance ratio as compared to said X-free comparison material, wherein X is one or more elements selected from the group consisting of Mg, Sc, Al, Zn, Cd and the rare earths that have an ionic radius smaller than that of La.

* * * * *